(12) United States Patent
Tanaka

(10) Patent No.: US 9,413,324 B2
(45) Date of Patent: Aug. 9, 2016

(54) ELECTRONIC COMPONENT

(71) Applicant: Murata Manufacturing Co., Ltd., Nagaokakyo-shi, Kyoto-fu (JP)

(72) Inventor: Akira Tanaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/730,288

(22) Filed: Jun. 4, 2015

(65) Prior Publication Data

US 2015/0381134 A1 Dec. 31, 2015

(30) Foreign Application Priority Data

Jun. 27, 2014 (JP) .................... 2014-132409

(51) Int. Cl.
| | | |
|---|---|---|
| *H01P 5/18* | (2006.01) | |
| *H03H 7/01* | (2006.01) | |
| *H03H 7/09* | (2006.01) | |
| *H03H 7/46* | (2006.01) | |
| *H03H 1/00* | (2006.01) | |

(52) U.S. Cl.
CPC ............... *H03H 7/0115* (2013.01); *H03H 7/09* (2013.01); *H03H 7/463* (2013.01); *H03H 2001/0085* (2013.01)

(58) Field of Classification Search
CPC .................................... H01P 5/18; H03H 1/00
USPC .......................................... 333/109–112, 116
See application file for complete search history.

(56) References Cited

U.S. PATENT DOCUMENTS

| | | | | |
|---|---|---|---|---|
| 6,603,960 | B1 * | 8/2003 | Oida ........................ | H01P 5/185 455/115.3 |
| 7,149,496 | B2 * | 12/2006 | Horiuchi ................ | H04B 1/005 455/333 |
| 7,978,021 | B2 * | 7/2011 | Tamaru ..................... | H03H 7/42 333/246 |
| 8,629,736 | B2 * | 1/2014 | Tamaru ..................... | H01P 5/18 333/109 |
| 8,773,216 | B2 * | 7/2014 | Dupont ..................... | H01P 5/18 333/109 |
| 8,922,295 | B2 * | 12/2014 | Haruna ..................... | H01P 5/185 333/109 |
| 9,035,717 | B2 * | 5/2015 | Tanaka ...................... | H03H 7/42 333/109 |
| 2005/0116787 | A1 * | 6/2005 | Ohi .......................... | H03H 7/42 333/25 |
| 2015/0137907 | A1 * | 5/2015 | Ji ............................ | H01P 5/185 333/116 |
| 2015/0236666 | A1 * | 8/2015 | Ootsuka .................. | H01P 5/185 333/109 |
| 2015/0263406 | A1 * | 9/2015 | Ohashi .................... | H01P 5/187 333/110 |

FOREIGN PATENT DOCUMENTS

| | | |
|---|---|---|
| JP | 3945170 B2 | 7/2007 |
| JP | 4432059 B2 | 3/2010 |

* cited by examiner

*Primary Examiner* — Dean Takaoka
(74) *Attorney, Agent, or Firm* — Keating & Bennett, LLP

(57) ABSTRACT

An electronic component includes an input port, a first output port, a ground port, a first capacitor and a second capacitor that are electrically connected in series to one another in a path between the input port and the first output port, a first inductor connected between the ground port and a portion of the path between the input port and the first output port, a second inductor electrically connected in parallel to the second capacitor, and a first sub line, wherein the second inductor and the first sub line define a first directional coupler by generating electromagnetic coupling therebetween.

20 Claims, 14 Drawing Sheets

ELECTRONIC COMPONENT

BACKGROUND OF THE INVENTION

1. Field of the Invention

The present invention relates to electronic components, and more particularly to an electronic component including a directional coupler.

2. Description of the Related Art

As one example of electronic components in the related art, a bandpass filter described in Japanese Patent No. 4432059 is known. This bandpass filter includes a three-stage LC parallel resonator and a sub line. In the three-stage LC parallel resonator, three stages of LC parallel resonators are arranged in one line, and each LC parallel resonator is electromagnetically coupled to an adjacent LC parallel resonator. The sub line is electromagnetically coupled to inductors of the respective LC parallel resonators. In such a bandpass filter described above, a signal having the power proportional to the power of a signal passing through the three-stage LC parallel resonator is outputted from a port connected to the sub line.

In the bandpass filter described in Japanese Patent No. 4432059 uses the three-stage LC parallel resonator. Having different resonance frequencies in the three-stage LC parallel resonator allows the bandpass filter to form a desired pass band. However, to obtain a broader pass band, a larger number of LC parallel resonators are needed. This raises an issue of size increase in the bandpass filter.

SUMMARY OF THE INVENTION

Accordingly, preferred embodiments of the present invention provide an electronic component with a broadened pass band while preventing a size increase.

An electronic component according to a preferred embodiment of the present invention includes an input port; a first output port; a ground port; a first capacitor and a second capacitor that are electrically connected in series to one another in a path between the input port and the first output port; a first inductor connected between the ground port and a portion of the path between the input port and the first output port; a second inductor electrically connected in parallel to the second capacitor; and a first sub line, wherein the second inductor and the first sub line define a first directional coupler by generating electromagnetic coupling therebetween.

According to preferred embodiments of the present invention, the pass band is broadened while preventing a size increase.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
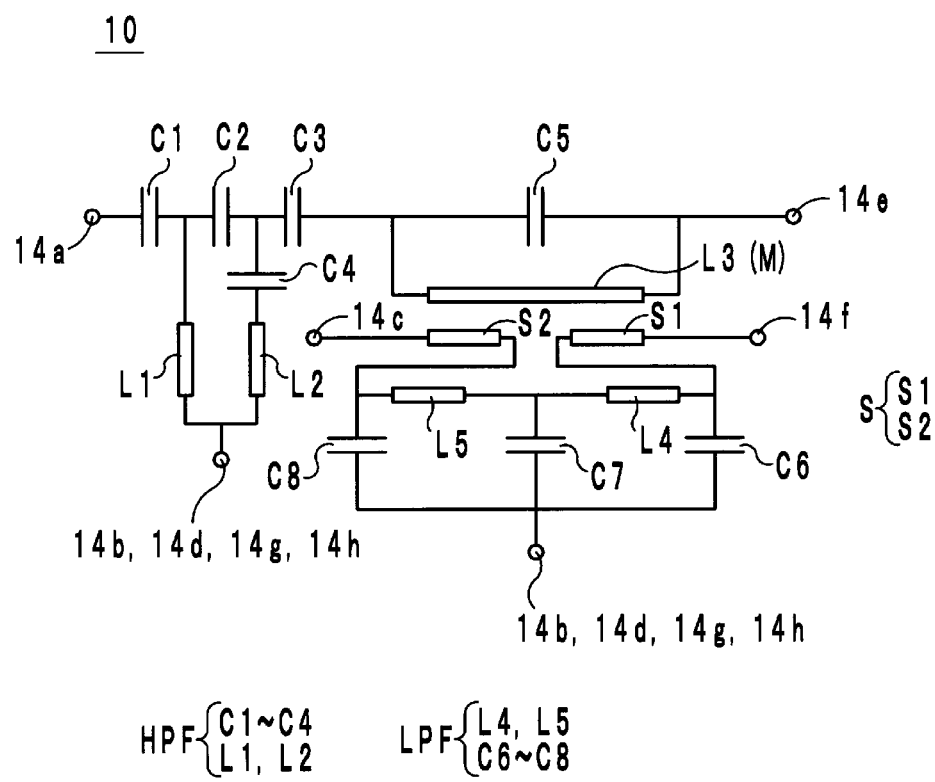
FIG. 1 is an equivalent circuit diagram of an electronic component.

A circuit configuration of an electronic component according to one preferred embodiment of the present invention is now described with reference to the drawings. FIG. 1 is an equivalent circuit diagram of an electronic component 10.

The electronic component 10 is used at a predetermined frequency band. The predetermined frequency bands may include, for example, frequency bands between about 1710 MHz and about 2170 MHz (Band 1 to Band 4) and a frequency band between about 2500 MHz and about 2690 MHz (Band 7). In cases where signals of those frequency bands are to be inputted to the electronic component 10, the predetermined frequency band of the electronic component 10 preferably is between about 1710 MHz and about 2690 MHz, for example.

The electronic component 10 includes, as circuit elements, outer electrodes (ports) 14a-14h, capacitors C1-C8, inductors L1-L5, and a sub line S. The capacitors C1-C3 and C5 are electrically connected in series in this order from the outer electrode 14a to the outer electrode 14e in a path between the outer electrode 14a and the outer electrode 14e. The inductor L1 is connected to a midway portion between the capacitor C1 and the capacitor C2 and the outer electrodes 14b, 14d, 14g, and 14h. The capacitor C4 (third capacitor) and the inductor L2 (first inductor) are electrically connected in series between a midway portion between the capacitor C2 (first capacitor) and the capacitor C3 and the outer electrodes 14b, 14d, 14g, and 14h. The capacitors C1-C4, the inductor L1, and the inductor L2, which are connected as described above, define a high pass filter HPF that passes high frequency signals having frequencies higher than a predetermined cutoff frequency f1.

The inductor L3 (second inductor) is electrically connected in parallel to the capacitor C5 (second capacitor). The inductor L3 and the capacitor C5 define a LC parallel resonator having a predetermined resonance frequency f2. The resonance frequency f2 is higher than the cutoff frequency f1. Thus, the pass band of the electronic component 10 is determined by the cutoff frequency f1 and the resonance frequency f2.

The sub line S includes sub line portions S1 and S2. The inductor L3 and the sub line S define a directional coupler by electromagnetically coupling to one another. In other words, the inductor L3 also defines and functions as a main line M of the directional coupler.

The sub line portion S1, the inductors L4, L5, and the sub line portion S2 are electrically connected in series in this order from the outer electrode 14*f* to the outer electrode 14*c* in a path between the outer electrode 14*f* and the outer electrode 14*c*. The capacitor C6 is connected between a midway portion between the sub line portion S1 and the inductor L4 and the outer electrodes 14*b*, 14*d*, 14*g*, and 14*h*. The capacitor C7 is connected between a midway portion between the inductor L4 and the inductor L5 and the outer electrodes 14*b*, 14*d*, 14*g*, and 14*h*. The capacitor C8 is connected between a midway portion between the inductor L5 and the sub line portion S2 and the outer electrodes 14*b*, 14*d*, 14*g*, and 14*h*. The inductors L4, L5, and the capacitors C6-C8, which are connected as described above, define a low pass filter LPF. Accordingly, the sub line portion S1, the low pass filter LPF, and the sub line portion S2 are electrically connected in series in this order.

In the electronic component 10, the outer electrode 14*a* is used as an input port, and the outer electrode 14*e* is used as an output port. Further, the outer electrode 14*c* is used as a coupling port, and the outer electrode 14*f* is used as a terminator port to terminate at about 50Ω, for example. The outer electrodes 14*b*, 14*d*, 14*g* and 14*h* are used as ground ports to be grounded. Upon receiving input of a signal at the outer electrode 14*a*, the signal is outputted from the outer electrode 14*e*. Further, since the main line M and the sub line S are electromagnetically coupled to one another, a signal is outputted from the outer electrode 14*c* with the power proportional to the power of the signal outputted from the outer electrode 14*e*.

Figure 2:
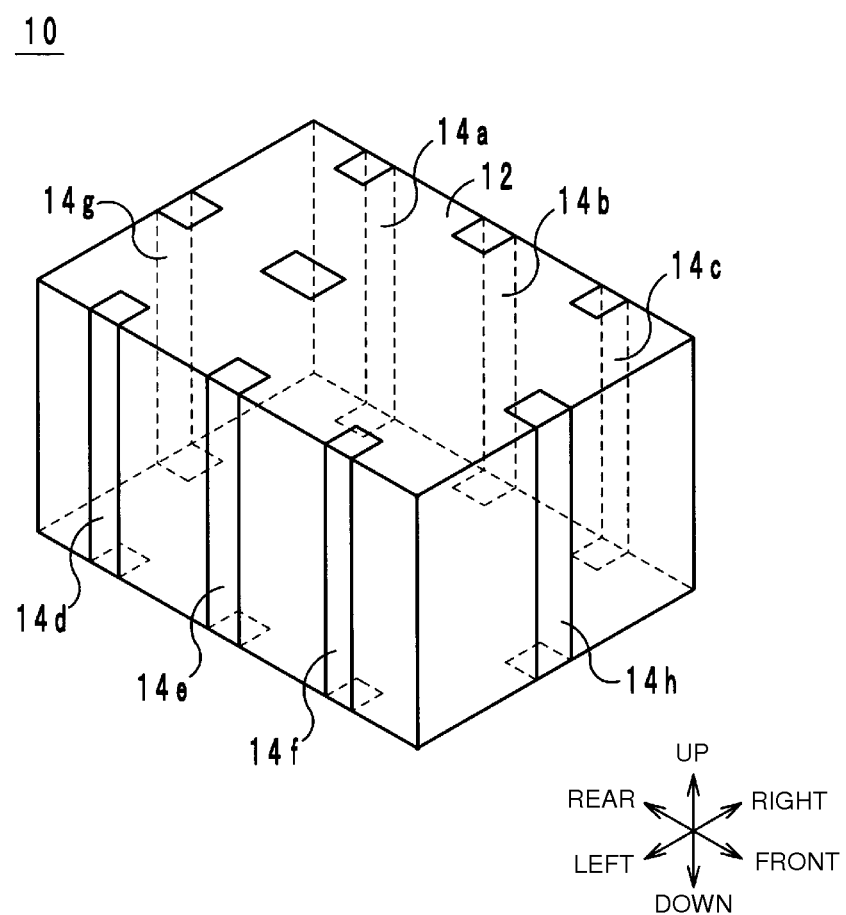
FIG. 2 is an external perspective view of the electronic component.
Figure 3:
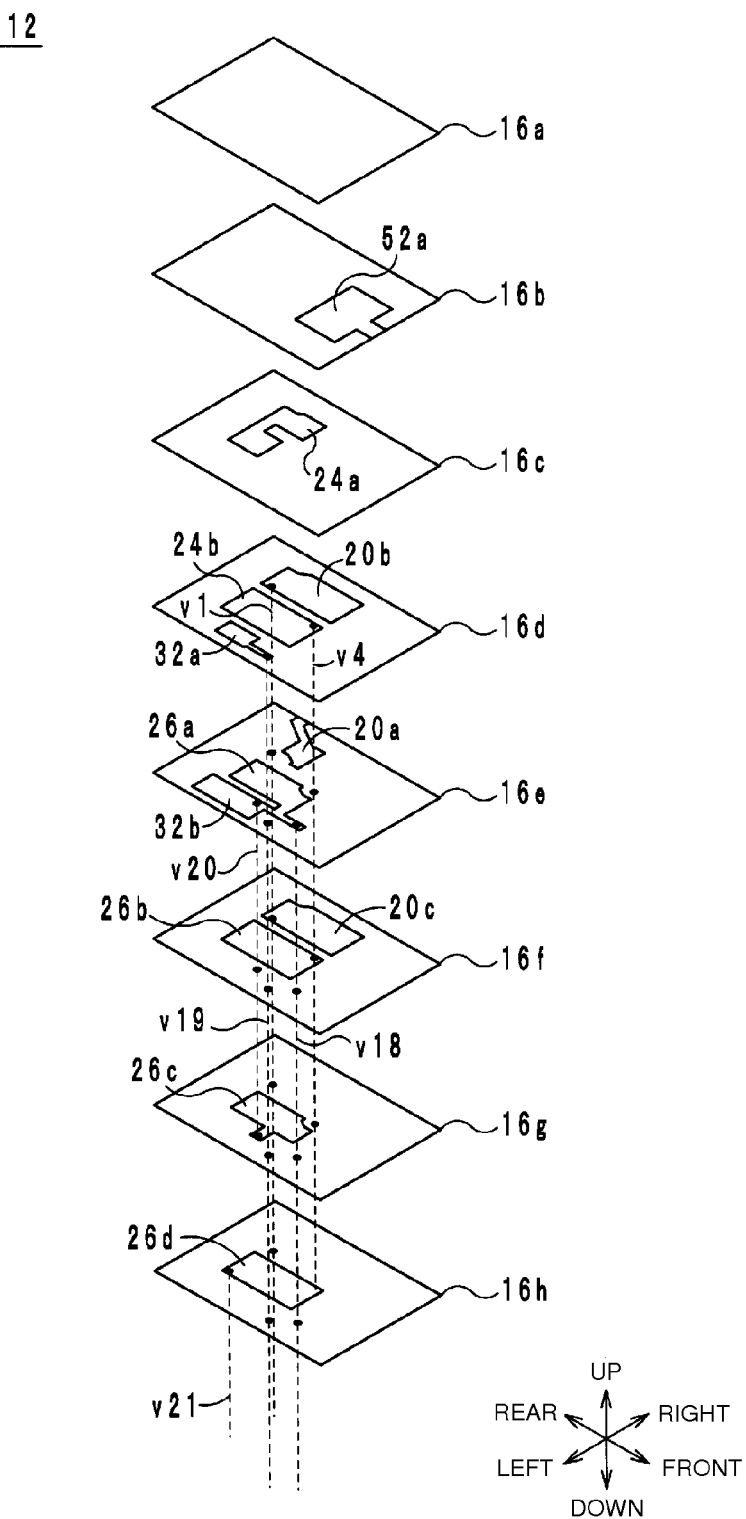
FIG. 3 is an exploded perspective view of a multilayer structure of the electronic component.
Figure 4:
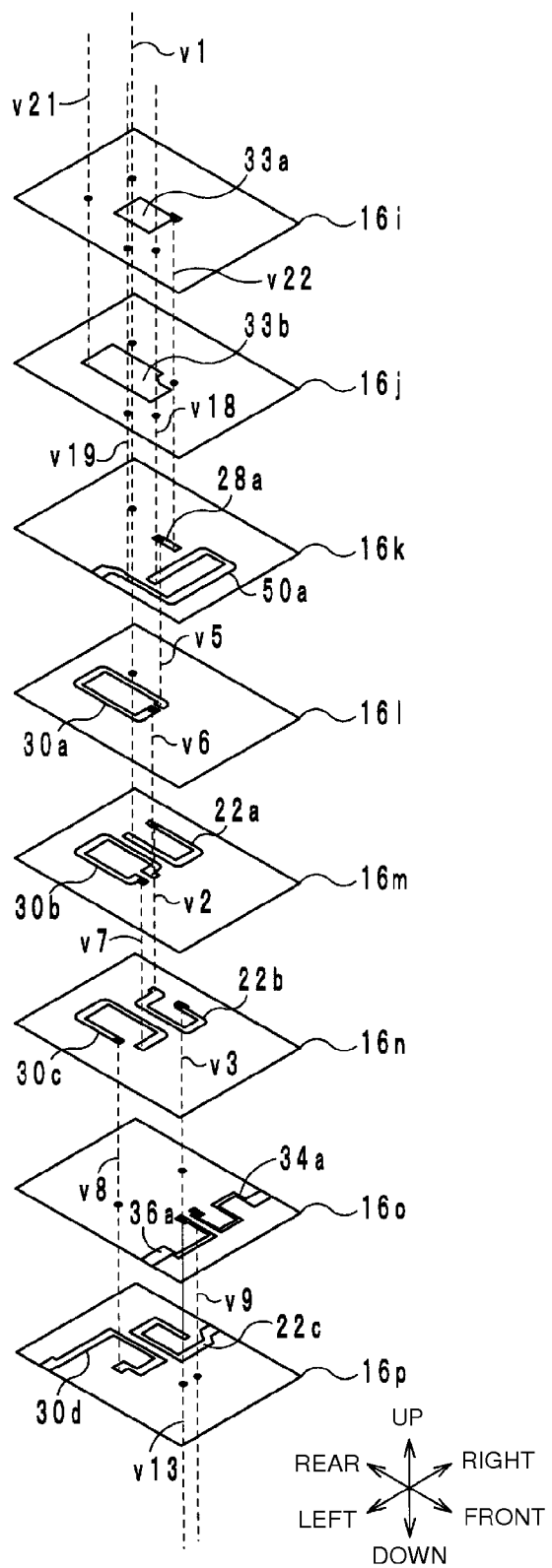
FIG. 4 is an exploded perspective view of the multilayer structure of the electronic component.
Figure 5:
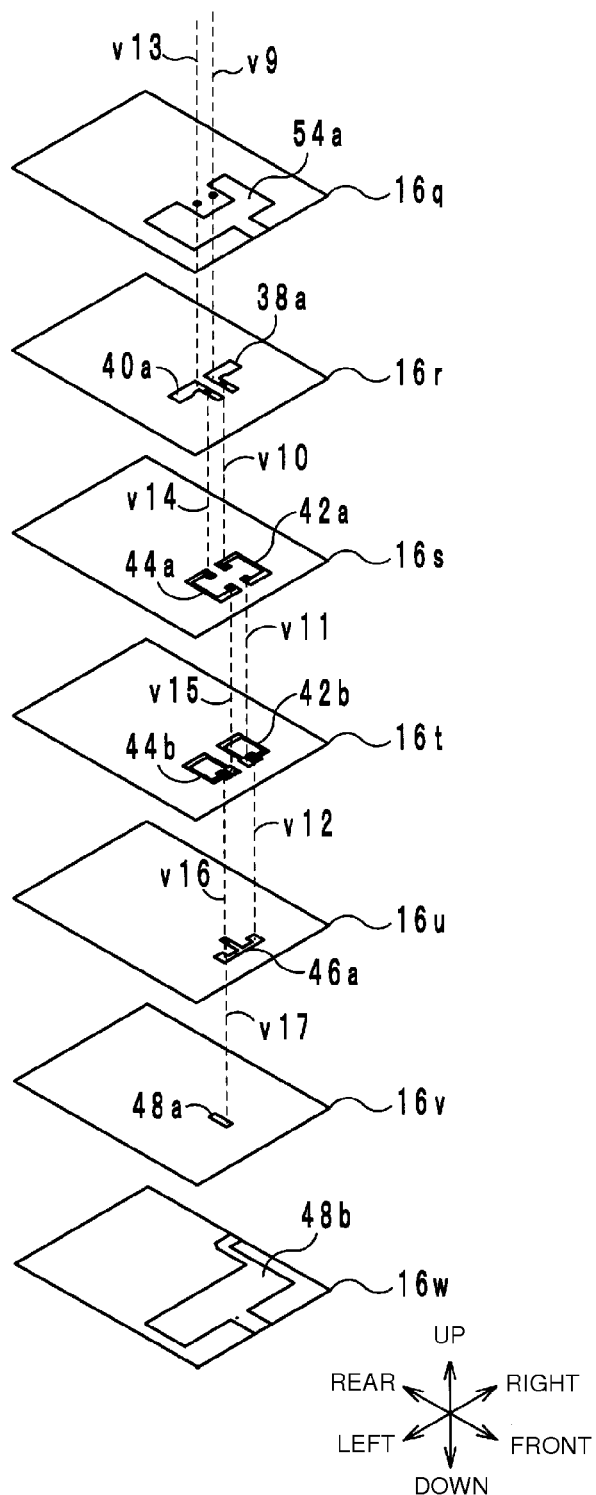
FIG. 5 is an exploded perspective view of the multilayer structure of the electronic component.

Next, a specific configuration of the electronic component 10 is described with reference to the drawings. FIG. 2 is an external perspective view of the electronic component 10. FIGS. 3-5 are exploded perspective views of a multilayer structure 12 of the electronic component 10. In the following description, a stacking direction is defined as an up-and-down direction, a direction along the longer side of the electronic component 10 in a planar view from above is defined as a front-and-rear direction, and a direction along the shorter side of the electronic component 10 in a planar view from above is defined as a left-and-right direction. The up-and-down direction, the front-and-rear direction, and the left-and-right direction are perpendicular or substantially perpendicular to each other.

As illustrated in FIG. 2 and FIGS. 3-5, the electronic component 10 includes the multilayer structure 12, the outer electrodes 14*a*-14*h*, capacitor conductors 20*a*-20*c*, inductor conductors 22*a*-22*c*, capacitor conductors 24*a*, 24*b*, 26*a*-26*c*, a connecting conductor 28*a*, inductor conductors 30*a*-30*d*, capacitor conductors 32*a*, 32*b*, capacitor conductors 33*a*, 33*b*, sub line conductors 34*a*, 36*a*, capacitor conductors 38*a*, 40*a*, inductor conductors 42*a*, 42*b*, 44*a*, 44*b*, a connecting conductor 46*a*, capacitor conductors 48*a*, 48*b*, an inductor conductor 50*a*, a ground conductor 52*a*, a capacitor conductor 54*a*, and via-hole conductors v1-v22.

The multilayer structure 12 is preferably cuboid or substantially cuboid in shape as illustrated in FIG. 2, and is configured preferably by stacking insulator layers 16*a*-16*w* in this order from top to bottom as illustrated in FIGS. 3-5. In the following description, in the multilayer structure 12, a surface at the top is referred to as a top surface, a surface at the bottom is referred to as a bottom surface, a surface at the front side is referred to as a front surface, a surface at the rear side is referred to as a rear surface, a surface at the right side is referred to as a right surface, and a surface at the left side is referred to as a left surface. The bottom surface of the multilayer structure 12 is a mounting plane that faces a circuit board when the electronic component 10 is mounted on the circuit board. The insulator layers 16*a*-16*w* are preferably elongated rectangular or substantially rectangular in shape and made of dielectric ceramic.

The outer electrodes 14*a*-14*c* are arranged so as to line up in this order on the right surface of the multilayer structure 12 from the rear side to the front side. The outer electrodes 14*a*-14*c* have belt shapes extending in the up-and-down direction. The outer electrodes 14*a*-14*c* are folded onto the top surface and the bottom surface at their both end portions in the up-and-down direction.

The outer electrodes 14*d*-14*f* are arranged so as to line up in this order on the left surface of the multilayer structure 12 from the rear side to the front side. The outer electrodes 14*d*-14*f* each have a belt shape extending in the up-and-down direction. The outer electrodes 14*d*-14*f* are folded onto the top surface and the bottom surface at their both end portions in the up-and-down direction.

The outer electrode 14*g* is provided at the rear surface of the multilayer body 12. The outer electrode 14*g* has a belt shape extending in the up-and-down direction. The outer electrode 14*g* is folded onto the top surface and the bottom surface at its both end portions in the up-and-down direction.

The outer electrode 14*h* is provided at the front surface of the multilayer body 12. The outer electrode 14*h* has a belt shape extending in the up-and-down direction. The outer electrode 14*h* is folded onto the top surface and the bottom surface at its both end portions in the up-and-down direction.

The capacitor C1 includes the capacitor conductors 20*a*-20*c*. The capacitor conductor 20*a* preferably is a rectangular or substantially rectangular conductor layer provided at an area located in the right rear quarter of the surface of the insulator layer 16*e*. The capacitor conductor 20*a* is extended to the right longer side of the insulator layer 16*e*. This connects the capacitor conductor 20*a* and the outer electrode 14*a*.

The capacitor conductor 20*b* preferably is a rectangular or substantially rectangular conductor layer provided at an area located in the right rear quarter of the surface of the insulator layer 16*d*. In a planar view from above, the capacitor conductor 20*b* overlaps the capacitor conductor 20*a*. The capacitor conductor 20*c* preferably is a rectangular or substantially rectangular conductor layer provided at an area located in the right rear quarter of the surface of the insulator layer 16*f*. In a planar view from above, the capacitor conductor 20*c* overlaps the capacitor conductor 20*a*. In this way, the capacitor C1 is provided between the capacitor conductor 20*a* and the capacitor conductors 20*b* and 20*c*.

The capacitor C2 includes the capacitor conductors 20*b*, 24*a*, and 24*b*. The capacitor conductor 24*a* is a conductor layer provided at an area located in the rear half of the surface of the insulator layer 16*c*. The capacitor conductor 24*a* has a structure in which two elongated rectangular or substantially rectangular conductor layers lining up in the left-and-right direction are connected to one another. In a planar view from above, the right half of the capacitor conductor 24*a* overlaps the capacitor conductor 20*b*.

The capacitor conductor 24*b* preferably is a rectangular or substantially rectangular conductor layer provided at an area located in the left rear quarter of the surface of the insulator layer 16*d*. In a planar view from above, the capacitor conductor 24*b* overlaps the left half of the capacitor conductor 24*a*. In this way, the capacitor C2 is provided between the capacitor conductor 20*b* and the capacitor conductor 24*b*. The capacitor conductor 20*b* doubles as part of the capacitor C1 and part of the capacitor C2. Thus, the capacitor C1 and the capacitor C2 are connected to one another.

The capacitor C3 includes the capacitor conductors 24b and 26a-26d. The capacitor conductor 26a preferably is a rectangular or substantially rectangular conductor layer provided at an area located in the left rear quarter of the surface of the insulator layer 16e. The capacitor conductor 26b preferably is a rectangular or substantially rectangular conductor layer provided at an area located in the left rear quarter of the surface of the insulator layer 16f. The capacitor conductor 26c preferably is a rectangular or substantially rectangular conductor layer provided at an area located in the left rear quarter of the surface of the insulator layer 16g. The capacitor conductor 26d preferably is a rectangular or substantially rectangular conductor layer provided at an area located in the left rear quarter of the surface of the insulator layer 16h. In a planar view from above, the capacitor conductors 24b and 26a-26d overlap one another. In this way, the capacitor C3 is provided between the capacitor conductors 26a and 26c and the capacitor conductors 24b, 26b, and 26d. The capacitor conductor 24b doubles as part of the capacitor C2 and part of the capacitor C3. Thus, the capacitor C2 and the capacitor C3 are connected to one another.

The via-hole conductor v20 penetrates the insulator layers 16e and 16f in the up-and-down direction and connects the capacitor conductor 32b and the capacitor conductor 26c.

The capacitor C5 includes the capacitor conductors 32a and 32b. The capacitor conductor 32a preferably is a rectangular or substantially rectangular conductor layer provided at an area located in the left rear quarter of the surface of the insulator layer 16d. The capacitor conductor 32b preferably is a rectangular or substantially rectangular conductor layer provided at an area located in the left rear quarter of the surface of the insulator layer 16e. In a planar view from above, the capacitor conductors 32a and 32b overlap one another. In this way, the capacitor C5 is provided between the capacitor conductor 32a and the capacitor conductor 32b. Further, the capacitor conductor 32b is connected to the capacitor conductor 26a. This connects the capacitor C3 and the capacitor C5.

The inductor L1 includes the inductor conductors 22a-22c, the via-hole conductor v2, and the via-hole conductor v3. The inductor conductor 22a is a line-shaped or substantially line-shaped conductor layer provided at an area located in the right rear quarter of the surface of the insulator layer 16m. The inductor conductor 22a extends around approximately three-quarter of the full revolution in the anti-clockwise direction. The inductor conductor 22b is a line-shaped or substantially line-shaped conductor layer provided at an area located in the right rear quarter of the surface of the insulator layer 16n. The inductor conductor 22b extends around approximately seven-eighths of the full revolution in the anti-clockwise direction. The inductor conductor 22c is a line-shaped or substantially line-shaped conductor layer provided at an area located in the right rear quarter of the surface of the insulator layer 16p. The inductor conductor 22c extends around approximately seven-eighths of the full revolution in the anti-clockwise direction. An end portion of the inductor conductor 22c at the downstream side in the anti-clockwise direction is extended to the right longer side of the insulator layer 16p. This connects the inductor conductor 22c and the outer electrode 14b.

The via-hole conductor v2 penetrates the insulator layer 16m in the up-and-down direction. The via-hole conductor v2 connects, in the anti-clockwise direction, a downstream-side end portion of the inductor conductor 22a to an upstream-side end portion of the inductor conductor 22b. The via-hole conductor v3 penetrates the insulator layers 16n and 16o in the up-and-down direction. The via-hole conductor v3 connects, in the anti-clockwise direction, a downstream-side end portion of the inductor conductor 22b to an upstream-side end portion of the inductor conductor 22c. In this way, the inductor L1 defines a spiral extending from the upper side to the lower side while turning in the anti-clockwise direction.

The via-hole conductor v1 penetrates the insulator layers 16d-16l in the up-and-down direction. The via-hole conductor v1 connects the capacitor conductors 20b and 20c and an upstream-side end portion of the inductor conductor 22a the in the anti-clockwise direction. This connects the capacitor C1 and the capacitor C2 to the inductor L1.

The via-hole conductor v4 penetrates the insulator layers 16d-16g in the up-and-down direction and connects the capacitor conductor 24b, the capacitor conductor 26b, and the capacitor conductor 26d. This connects the capacitor C2 and the capacitor C3.

The capacitor C4 includes the capacitor conductors 26d, 33a, and 33b. The capacitor conductor 33a preferably is a rectangular or substantially rectangular conductor layer provided at an area located in the left rear quarter of the surface of the insulator layer 16i. The capacitor conductor 33b preferably is a rectangular or substantially rectangular conductor layer provided at an area located in the left rear quarter of the surface of the insulator layer 16j. In a planar view from above, the capacitor conductors 26d, 33a, and 33b overlap one another. In this way, the capacitor C4 is provided between the capacitor conductors 26d and 33b and the capacitor conductor 33a. The capacitor conductor 26d doubles as part of the capacitor C3 and part of the capacitor C4. This connects the capacitor C3 and the capacitor C4.

The inductor L2 includes the inductor conductors 30a-30d and the via-hole conductors v6-v8. The inductor conductor 30a is a line-shaped or substantially line-shaped conductor layer provided at an area located in the left rear quarter of the surface of the insulator layer 16l. The inductor conductor 30a extends around approximately one full revolution in the anti-clockwise direction. The inductor conductor 30b is a line-shaped or substantially line-shaped conductor layer provided at an area located in the left rear quarter of the surface of the insulator layer 16m. The inductor conductor 30b extends around approximately one full revolution in the anti-clockwise direction. The inductor conductor 30c is a line-shaped or substantially line-shaped conductor layer provided at an area located in the left rear quarter of the surface of the insulator layer 16n. The inductor conductor 30c extends around approximately seven-eighths of the full revolution in the anti-clockwise direction. The inductor conductor 30d is a line-shaped or substantially line-shaped conductor layer provided at an area located in the left rear quarter of the surface of the insulator layer 16p. The inductor conductor 30d extends around approximately seven-eighths of the full revolution in the anti-clockwise direction. An end portion of the inductor conductor 30d at the downstream side in the anti-clockwise direction is extended to the left longer side of the insulator layer 16p. This connects the inductor conductor 30d and the outer electrode 14d.

The via-hole conductor v6 penetrates the insulator layer 16l in the up-and-down direction. The via-hole conductor v6 connects, in the anti-clockwise direction, a downstream-side end portion of the inductor conductor 30a to an upstream-side end portion of the inductor conductor 30b. The via-hole conductor v7 penetrates the insulator layer 16m in the up-and-down direction. The via-hole conductor v7 connects, in the anti-clockwise direction, a downstream-side end portion of the inductor conductor 30b to an upstream-side end portion of the inductor conductor 30c. The via-hole conductor v8 penetrates the insulator layers 16n and 16o in the up-and-down direction. The via-hole conductor v8 connects, in the anti-clockwise direction, a downstream-side end portion of the inductor conductor 30c to an upstream-side end portion of the inductor conductor 30d. In this way, the inductor L2 defines a spiral extending from the upper side to the lower side while turning in the anti-clockwise direction.

The connecting conductor 28a is a line-shaped or substantially line-shaped conductor layer extending in the front-and-rear direction and is provided near the center (cross section of diagonal lines) of the insulator layer 16k. The via-hole conductor v22 penetrates the insulator layers 16i and 16j in the up-and-down direction and connects the capacitor conductor 33a and a front end portion of the connecting conductor 28a. The via-hole conductor v5 penetrates the insulator layer 16k in the up-and-down direction. The via-hole conductor v5 connects a rear end portion of the connecting conductor 28a to an upstream-side end portion of the inductor conductor 30a in the anti-clockwise direction. This connects the capacitor C4 and the inductor L2.

The inductor L3 includes the inductor conductor 50a. The inductor conductor 50a is a line-shaped or substantially line-shaped conductor layer provided at an area located in the front half of the surface of the insulator layer 16k. The inductor conductor 50a extends around approximately one full revolution in the clockwise direction. An end portion of the inductor conductor 50a at the downstream side in the clockwise direction is extended to the left longer side of the insulator layer 16k. This connects the inductor conductor 50a and the outer electrode 14e.

The via-hole conductor v18 penetrates the insulator layers 16e-16j in the up-and-down direction. The via-hole conductor v18 connects the capacitor conductors 26a and 32b to an upstream-side end portion of the inductor conductor 50a in the clockwise direction. This connects the capacitors C3 and C5 and the inductor L5.

The via-hole conductor v19 penetrates the insulator layers 16d-16j in the up-and-down direction. The via-hole conductor v19 connects the capacitor conductor 32a and a downstream-side end portion of the inductor conductor 50a in the clockwise direction. This connects the capacitor C5 and the outer electrode 14e.

The sub line portion S1 includes the sub line conductor 36a. The sub line conductor 36a is a line-shaped or substantially line-shaped conductor layer provided at an area located in the left front quarter of the surface of the insulator layer 16o. The sub line conductor 36a extends around approximately one-half of the full revolution in the anti-clockwise direction. An end portion of the sub line conductor 36a at the upstream side in the anti-clockwise direction is extended to the left longer side of the insulator layer 16o. This connects the sub line conductor 36a and the outer electrode 14f. In a planar view from above, an area surrounded by the sub line conductor 36a overlaps an area surrounded by the inductor conductor 50a. This generates electromagnetic coupling between the sub line portion S1 and the inductor L3 (main line M).

The sub line portion S2 includes the sub line conductor 34a. The sub line conductor 34a is a line-shaped or substantially line-shaped conductor layer provided at an area located in the right front quarter of the surface of the insulator layer 16o. The sub line conductor 34a extends around approximately one-half of the full revolution in the anti-clockwise direction. An end portion of the sub line conductor 34a at the downstream side in the anti-clockwise direction is extended to the right longer side of the insulator layer 16o. This connects the sub line conductor 34a and the outer electrode 14c. In a planar view from above, an area surrounded by the sub line conductor 34a overlaps the area surrounded by the inductor conductor 50a. This generates electromagnetic coupling between the sub line portion S2 and the inductor L3 (main line M).

The capacitor C6 includes the capacitor conductors 40a and 54a. The capacitor conductor 40a preferably is a rectangular or substantially rectangular conductor layer provided at an area located in the left front quarter of the surface of the insulator layer 16r. The capacitor conductor 54a is a conductor layer provided at an area located in the front half of the surface of the insulator layer 16q. The capacitor conductor 54a preferably has a rectangular or substantially rectangular shape, a portion of which is cut out. The capacitor conductor 54a is extended to the front shorter side of the insulator layer 16q. This connects the capacitor conductor 54a and the outer electrode 14h. In a planar view from above, the capacitor conductor 40a and the capacitor conductor 54a overlap one another. In this way, the capacitor C6 is provided between the capacitor conductor 40a and the capacitor conductor 54a.

The capacitor C8 includes the capacitor conductors 38a and 54a. The capacitor conductor 38a preferably is a rectangular or substantially rectangular conductor layer provided at an area located in the right front quarter of the surface of the insulator layer 16r. In a planar view from above, the capacitor conductor 38a and the capacitor conductor 54a overlap one another. In this way, the capacitor C8 is provided between the capacitor conductor 38a and the capacitor conductor 54a.

The via-hole conductor v13 penetrates the insulator layers 16o-16q in the up-and-down direction. The via-hole conductor v13 connects a downstream-side end portion of the sub line conductor 36a in the anti-clockwise direction to the capacitor conductor 40a. This connects the sub line portion S1 and the capacitor C6.

The via-hole conductor v9 penetrates the insulator layers 16o-16q in the up-and-down direction. The via-hole conductor v9 connects an upstream-side end portion of the sub line conductor 34a in the anti-clockwise direction to the capacitor conductor 38a. This connects the sub line portion S2 and the capacitor C8.

The inductor L4 includes the inductor conductors 44a, 44b and the via-hole conductor v15. The inductor conductor 44a is a line-shaped or substantially line-shaped conductor layer provided at an area located in the left front quarter of the surface of the insulator layer 16s. The inductor conductor 44a extends around approximately three-quarter of the full revolution in the anti-clockwise direction. The inductor conductor 44b is a line-shaped or substantially line-shaped conductor layer provided at an area located in the left front quarter of the surface of the insulator layer 16t. The inductor conductor 44b extends around approximately one full revolution in the anti-clockwise direction. The via-hole conductor v15 penetrates the insulator layer 16s in the up-and-down direction. The via-hole conductor v15 connects, in the anti-clockwise direction, a downstream-side end portion of the inductor conductor 44a to an upstream-side end portion of the inductor conductor 44b. In this way, the inductor L4 defines a spiral extending from the upper side to the lower side while turning in the anti-clockwise direction.

The inductor L5 includes the inductor conductors 42a, 42b and the via-hole conductor v11. The inductor conductor 42a is a line-shaped or substantially line-shaped conductor layer provided at an area located in the right front quarter of the surface of the insulator layer 16s. The inductor conductor 42a extends around approximately three-quarter of the full revolution in the anti-clockwise direction. The inductor conductor 42b is a line-shaped or substantially line-shaped conductor layer provided at an area located in the right front quarter of the surface of the insulator layer 16t. The inductor conductor 42b extends around approximately one full revolution in the anti-clockwise direction. The via-hole conductor v11 penetrates the insulator layer 16s in the up-and-down direction. The via-hole conductor v11 connects, in the anti-clockwise direction, an upstream-side end portion of the inductor conductor 42a to a downstream-side end portion of the inductor conductor 42b. In this way, the inductor L5 defines a spiral extending from the lower side to the upper side while turning in the anti-clockwise direction.

The via-hole conductor v14 penetrates the insulator layer 16r in the up-and-down direction. The via-hole conductor v14 connects the capacitor conductor 40a to an upstream-side end portion of the inductor conductor 44a in the anti-clockwise direction. This connects the capacitor C8 and the inductor L5.

The via-hole conductor v10 penetrates the insulator layer 16r in the up-and-down direction. The via-hole conductor v10 connects the capacitor conductor 38a to a downstream-side end portion of the inductor conductor 42a in the anti-clockwise direction. This connects the capacitor C8 and the inductor L5.

The capacitor C7 includes the capacitor conductors 48a and 48b. The capacitor conductor 48a is elongated rectangular or substantially rectangular in shape and provided at an area located in the front half of the surface of the insulator layer 16v. The capacitor conductor 48b is elongated rectangular or substantially rectangular in shape and provided at an area located in the front half of the surface of the insulator layer 16w. The capacitor conductor 48b is extended to the front shorter side and the right longer side of the insulator layer 16w. This connects the capacitor conductor 48b to the outer electrodes 14b and 14h. In a planar view from above, the capacitor conductor 48a and the capacitor conductor 48b overlap one another. In this way, the capacitor C7 is provided between the capacitor conductor 48a and the capacitor conductors 48b.

The connecting conductor 46a is a T-shaped or substantially T-shaped line-shaped conductor layer provided at an area located in the front half of the surface of the insulator layer 16u.

The via-hole conductor v16 penetrates the insulator layer 16t in the up-and-down direction. The via-hole conductor v16 connects a downstream-side end portion of the inductor conductor 44b in the anti-clockwise direction to the connecting conductor 46a. The via-hole conductor v12 penetrates the insulator layer 16t in the up-and-down direction. The via-hole conductor v12 connects an upstream-side end portion of the inductor conductor 42b in the anti-clockwise direction to the connecting conductor 46a. The via-hole conductor v17 penetrates the insulator layer 16u in the up-and-down direction and connects the connecting conductor 46a and the capacitor conductor 48a. This connects the inductors L4 and L5 and the capacitor C7.

The ground conductor 52a preferably is a rectangular or substantially rectangular conductor layer provided at an area located in the front half of the surface of the insulator layer 16b. The ground conductor 52a is extended to the front shorter side of the insulator layer 16b. This connects the ground conductor 52a and the outer electrode 14h.

According to the electronic component 10 according to the present preferred embodiment, the pass band is broadened while preventing the size increase. Specifically, the bandpass filter described in Japanese Patent No. 4432059 uses the three-stage LC parallel resonator. Setting different resonance frequencies in the three-stage LC parallel resonator allows the bandpass filter to obtain a desired pass band. However, to obtain a broader pass band, a larger number of LC parallel resonators is needed. This raises an issue of the size increase in the bandpass filter.

In view of the above, the electronic component 10 includes the high pass filter HPF including the capacitors C1-C4 and the inductors L1 and L2 and the LC parallel resonator composed of the capacitor C5 and the inductor L3. Here, the resonance frequency f2 of the LC parallel resonator is higher than the cutoff frequency f1 of the high pass filter HPF. This provides the electronic component 10 with the pass band from the cutoff frequency f1 to the resonance frequency f2, both inclusive. In this case, a broader pass band of the electronic component 10 is obtained by adjusting the cutoff frequency f1 and the resonance frequency f2, and the adjustment of the cutoff frequency f1 and the resonance frequency f2 is achieved by adjusting the capacitance values of the capacitors C1-C5 and the inductance values of the inductors L1-L3. In other words, in the electronic component 10, no additional stage is needed in the LC parallel resonator to broaden the pass band. Accordingly, in the electronic component 10, the pass band is broadened while preventing a size increase.

The inventor of the present application carried out the following computer simulation to further clarify the advantageous effects of the electronic component 10.

Figure 6A:
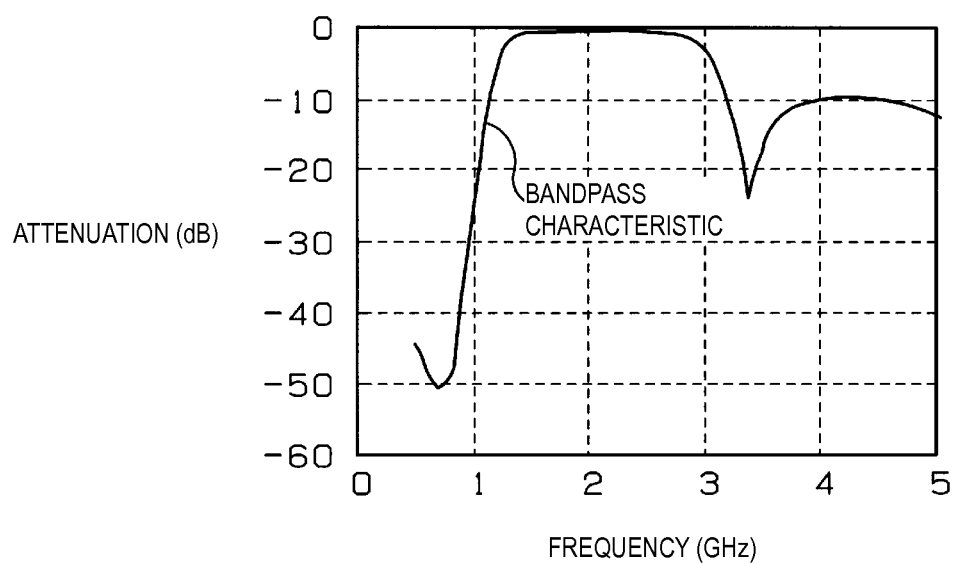
FIG. 6A is a graph depicting a bandpass characteristic of the electronic component.
Figure 6B:
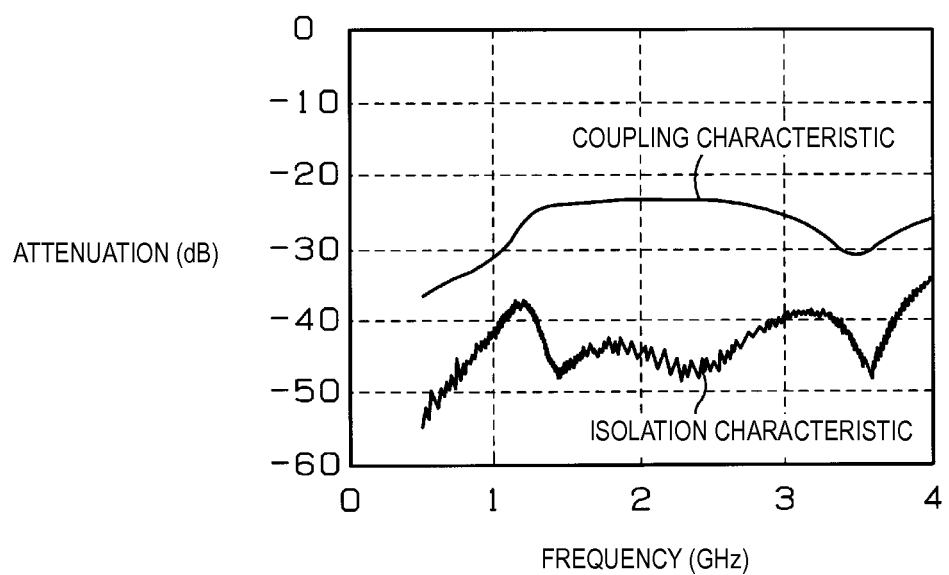
FIG. 6B is a graph depicting coupling and isolation characteristics of the electronic component.

FIG. 6A is a graph depicting the bandpass characteristic of the electronic component 10. FIG. 6B is a graph depicting the coupling characteristic and the isolation characteristic of the electronic component 10. In FIG. 6A and FIG. 6B, the vertical axis represents attenuation, and the horizontal axis represents frequency. The bandpass characteristic is the value of intensity ratio of the signal outputted from the outer electrode 14e to the intensity of the signal inputted to the outer electrode 14a. The coupling characteristic is the value of intensity ratio of the signal outputted from the outer electrode 14c to the intensity of the signal inputted to the outer electrode 14a. The isolation characteristic is the value of intensity ratio of the signal outputted from the outer electrode 14f to the intensity of the signal inputted to the outer electrode 14a.

As illustrated in FIG. 6A, it is indicated that the electronic component 10 has the pass band between the cutoff frequency f1 of the high pass filter and the resonance frequency f2 of the LC parallel resonator. Thus, it is clear that the pass band of the electronic component 10 is broadened by adjusting the cutoff frequency f1 and the resonance frequency f2. Further, as illustrated in FIG. 6B, the coupling characteristic and the isolation characteristic are also broadened as is the case with the bandpass characteristic.

In the electronic component 10, the inductor L3 defines and functions as the inductor of the LC parallel resonator as well as the main line M of the directional coupler. This reduces the size of the electronic component 10.

In the electronic component 10, directivity is improved as will be described below. FIG. 7A to FIG. 7E are diagrams depicting high frequency signals flowing through a directional coupler.

Figure 7A:
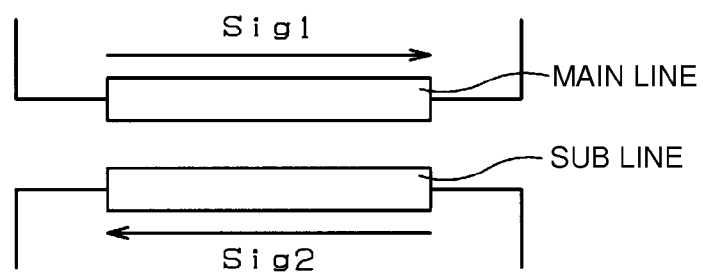
FIG. 7A is a diagram depicting high frequency signals flowing through a directional coupler.
Figure 7B:
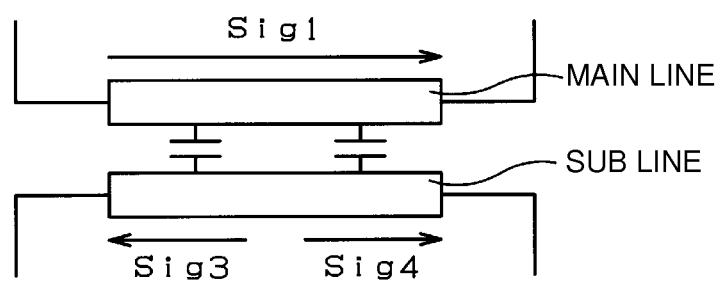
FIG. 7B is a diagram depicting high frequency signals flowing through a directional coupler.
Figure 7C:
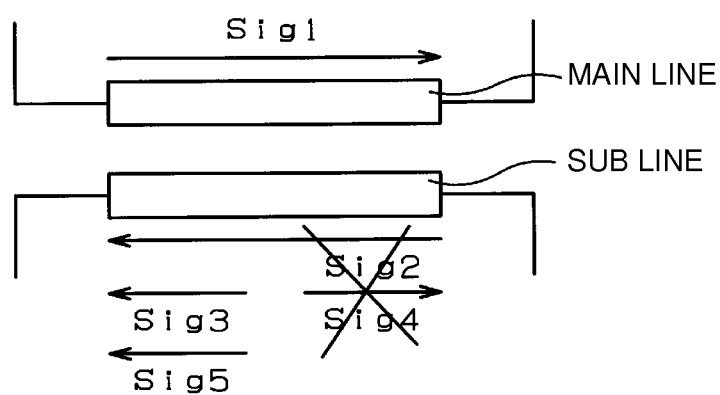
FIG. 7C is a diagram depicting high frequency signals flowing through a directional coupler.

In a directional coupler, even modes are generated at the time of magnetic coupling, and odd modes are generated at the time of capacitive coupling. As illustrated in FIG. 7A, in the even mode, a signal SIG2 flows the sub line in a direction opposite to the direction of a signal SIG1 flowing the main line due to electromagnetic induction by the magnetic coupling. On the other hand, as illustrated in FIG. 7B, in the odd mode, a signal SIG3 and a signal SIG4 flow the sub line due to electric field by the capacitive coupling. The signal SIG3 flows in a direction opposite to the direction of the signal SIG1. The signal SIG4 flows in the same direction as the direction of the signal SIG1. As described above, the main line and the sub line form the magnetic coupling as well as the capacitive coupling. Therefore, as illustrated in FIG. 7C, in the sub line, a portion of the signal SIG2 and the signal SIG4 cancel out one another. As a result, in the sub line, a signal SIG5 produced by cancelling of the portion of the signal SIG2 and the signal SIG4 flows in the direction opposite to the direction of the signal SIG1. In the directional coupler, it is desirable that no signal is outputted from a port (hereinafter, terminator port) to which the signal SIG4 of the sub line flows and that a signal is outputted from a port (hereinafter, coupling port) to which the signals SIG3 and SIG5 flow. The foregoing property, such that a signal is outputted only from the coupling port in the sub line of the directional coupler, is referred to as directivity.

Figure 7D:
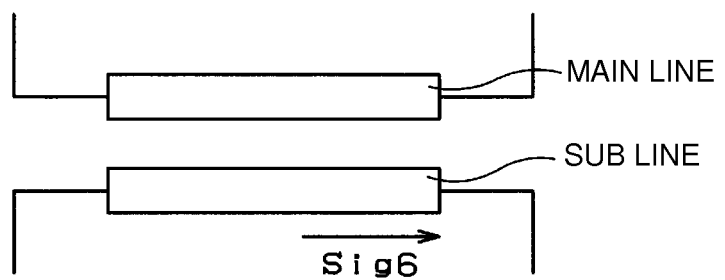
FIG. 7D is a diagram depicting high frequency signals flowing through a directional coupler.
Figure 7E:
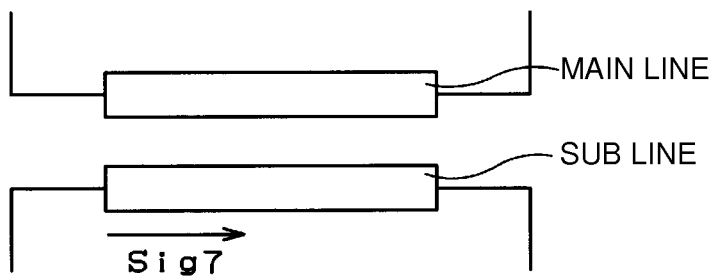
FIG. 7E is a diagram depicting high frequency signals flowing through a directional coupler.

However, in cases where the characteristic impedances of the main line and sub line deviate from a desired characteristic impedance (e.g., about 50Ω), signal reflection occurs at ports, to which the main line and the sub line are connected. Specifically, as illustrated in FIG. 7D, when the signal reflection occurs at the output port to which the main line is connected, a signal SIG6 is produced in the sub line by a reflected signal. As a result, the signal SIG6 is outputted from the terminator port. When the signal reflection occurs at the coupling port, as illustrated in FIG. 7E, a signal SIG7 is produced. As a result, the signal SIG7 is outputted from the terminator port. As described above, in cases where the characteristic impedances of the main line and the sub line deviate from the desired characteristic impedance (e.g., about 50Ω), the directivity of directional coupler decreases.

In view of the above, the ground conductor 52a, the capacitor conductor 54a, the inductor conductor 50a, the sub line conductor 34a, and the sub line conductor 36a are provided at the front half of the insulator layers 16b, 16q, 16k, and 16o. The ground conductor 52a is positioned above the inductor conductor 50a, the sub line conductor 34a, and the sub line conductor 36a, and is connected to the ground potential. The capacitor conductor 54a is positioned below the inductor conductor 50a, the sub line conductor 34a, and the sub line conductor 36a, and is connected to the ground potential. Accordingly, the inductor conductor 50a, the sub line conductor 34a, and the sub line conductor 36a that constitute the directional coupler are interposed between the ground conductor 52a and the capacitor conductor 54a in the up-and-down direction. This allows the ground conductor 52a, the capacitor conductor 54a, the inductor conductor 50a, and the sub line conductor 34a, and the sub line conductor 36a to define a stripline structure, thus making it possible to bring the characteristic impedance of the inductor conductor 50a, the sub line conductor 34a, and the sub line conductor 36a closer to the desired characteristic impedance (for example, about 50Ω). As a result, the directivity of the electronic component 10 improves.

Further, the capacitor C5 has an effect on reducing the wavelength of the inductor L3. This reduces the size of the electronic component 10.

In the electronic component 10, in a planar view from above, the capacitors C1-C4 that constitute the high pass filter HPF do not overlap the inductor conductor 50a, the sub line conductor 34a, and the sub line conductor 36a that constitute the directional coupler. In other words, in a planar view from above, the capacitor conductors 20a-20c, 24a, 24b, 26a-26d, 33a, and 33b do not overlap the inductor conductor 50a, the sub line conductor 34a, and the sub line conductor 36a. This prevents unwanted electromagnetic coupling that may cause the deviation of the characteristic impedances of the main line and the sub line. As a result, the directivity of the directional coupler improves.

In the electronic component 10, the inductor conductor 50a defining and functioning as the main line M (inductor L3) of the directional coupler is provided only at the surface of the insulator layer 16k. In other words, the main line M (inductor L3) includes a conductor layer having the length of substantially one full revolution in single layer. This allows the inductor conductor 50a to keep the distances to the ground conductor 52a and the capacitor conductor 54a constant or substantially constant. As a result, this facilitates the adjustment of the characteristic impedance of the inductor conductor 50a to the desired characteristic impedance.

In the electronic component 10, the inductor conductor 50a defining and functioning the inductor L3 is provided only at the surface of the insulator layer 16k. In other words, the inductor conductor 50a includes a single conductor layer. This allows the radius of air core of the inductor L3 to increase and allows to obtain a high Q-value at the inductor L3.

First Modified Preferred Embodiment

Figure 8:
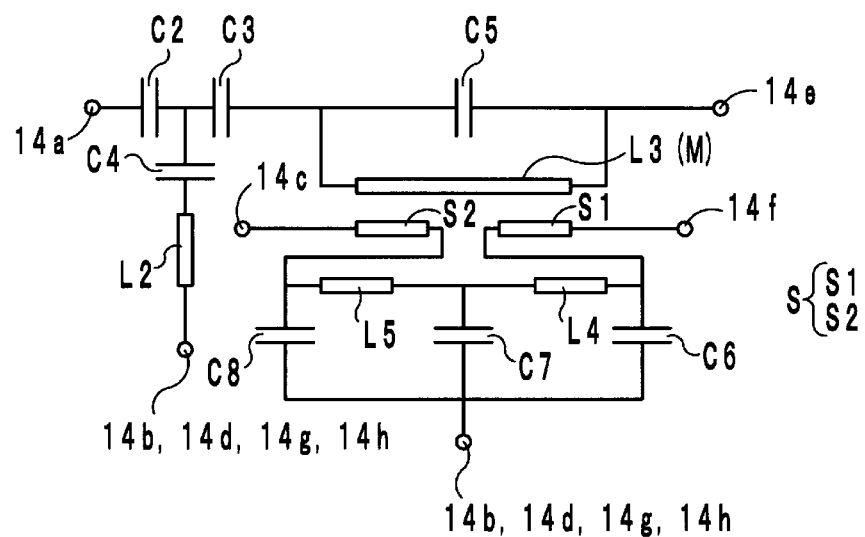
FIG. 8 is an equivalent circuit diagram of an electronic component according to a first modified preferred embodiment of the present invention.

Next, an electronic component 10a according to the first modified preferred embodiment is described. FIG. 8 is an equivalent circuit diagram of the electronic component 10a according to the first modified preferred embodiment.

The electronic component 10a differs from the electronic component 10 in absence of the capacitor C1 and the inductor L1. The remaining elements of the electronic component 10a are preferably the same or substantially the same as those of the electronic component 10, and descriptions thereof are omitted.

According to the electronic component 10a as described above, although the attenuation of the bandpass characteristic at the cutoff frequency f1 is relaxed in the high pass filter HPF, the insertion loss of the electronic component 10a is significantly reduced.

Second Modified Preferred Embodiment

Figure 9:
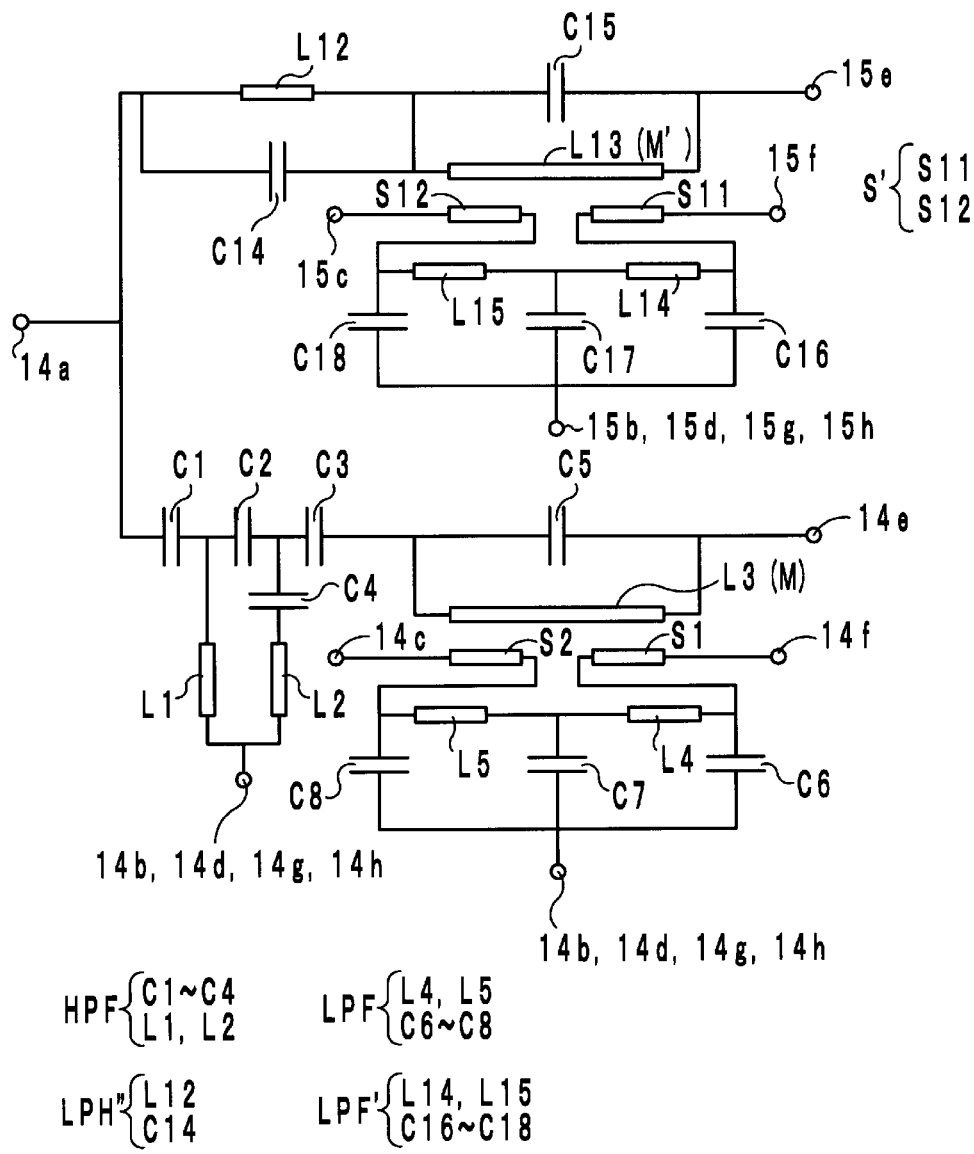
FIG. 9 is an equivalent circuit diagram of an electronic component according to a second modified preferred embodiment of the present invention.

Next, an electronic component 10b according to the second modified preferred embodiment is described. FIG. 9 is an equivalent circuit diagram of the electronic component 10b according to the second modified preferred embodiment.

The electronic component 10b is a diplexer with a directional coupler. Specifically, the electronic component 10b includes, as circuit elements, outer electrodes 14a-14h, 15b-15h, capacitors C1-C8, C14-C18, inductors L1-L5, L12-L15, a sub line S, and a sub line S'.

The outer electrodes 14a-14h, the capacitors C1-C8, the inductors L1-L5, and the sub line S in the electronic component 10b are preferably the same or substantially the same as the outer electrodes 14a-14h, the capacitors C1-C8, the inductors L1-L5, and the sub line S in the electronic component 10, respectively. Thus, descriptions thereof are omitted.

Further, the capacitors C15-C18, the inductors L13-L15, and the sub line S' are preferably the same or substantially the same as the capacitors C5-C8, the inductors L3-L5, and the sub line S, respectively. Thus, descriptions thereof are omitted.

The inductor L12 is connected between the outer electrode 14a and the capacitor C15. The capacitor C14 is electrically connected in parallel to the inductor L12. The inductor L12 and the capacitor C14 define a low pass filter LPF". The low pass filter LPF" is electrically connected in series to the capacitor C15.

Other Preferred Embodiments

Electronic components according to preferred embodiments of the present invention are not limited to the electronic components 10, 10a, and 10b, and modifications may be made within the scope of the present invention.

For example, in the electronic component 10, either the capacitor C3 or the capacitor C4 may be omitted, or both the capacitor C3 and the capacitor C4 may be omitted.

In the electronic component 10a, either the capacitor C3 or the capacitor C4 may be omitted, or both the capacitor C3 and the capacitor C4 may be omitted.

In the electronic component 10b, instead of electrically connecting the capacitor C14 in parallel to the inductor L12, the capacitor C14 may be connected between a ground port and a midway portion between the inductor L12 and the capacitor C15.

Further, in the electronic component 10, the position of the high pass filter HPF and the position of the LC parallel resonator including the capacitor C5 and the inductor L3 may be interchanged.

In the electronic component 10, portions to which the capacitor C4 and the inductor L2 are connected are not limited to the portions illustrated in FIG. 1, and may be connected to any other positions as long as the capacitor C4 and the inductor L2 are electrically connected in series between a portion of a path from the outer electrode 14a to the outer electrode 14e and the outer electrodes 14b, 14d, 14g, and 14h.

The structures of the electronic components 10, 10a, and 10b may be arbitrary combined.

As described above, the preferred embodiments of the present invention are useful for the electronic components, and more particularly, superior in broadening the pass band while preventing a size increase.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. An electronic component comprising:
   an input port;
   a first output port;
   a ground port;
   a first capacitor and a second capacitor that are electrically connected in series to one another in a path between the input port and the first output port;
   a first inductor connected between the ground port and a portion of the path between the input port and the first output port;
   a second inductor electrically connected in parallel to the second capacitor; and
   a first sub line; wherein
   the second inductor and the first sub line define a first directional coupler by generating electromagnetic coupling therebetween.

2. The electronic component according to claim 1, further comprising a third capacitor electrically connected in series to the first inductor between the ground port and a portion of the path between the input port and the first output port.

3. The electronic component according to claim 1, further comprising:
   a first low pass filter; wherein
   the first sub line includes a first sub line portion and a second sub line portion; and
   the first sub line portion, the first low pass filter, and the second sub line portion are electrically connected in series in order of description.

4. The electronic component according to claim 1, wherein
   the second inductor is electrically connected in parallel to the second capacitor;
   the second inductor and the second capacitor define a LC parallel resonator; and
   the first capacitor and the first inductor define a high pass filter.

5. The electronic component according to claim 1, further comprising:
   a second output port;
   a second low pass filter;
   a fourth capacitor;
   a third inductor electrically connected in parallel to the fourth capacitor; and
   a second sub line; wherein
   the second low pass filter and the fourth capacitor are electrically connected in series to one another between the input port and the second output port; and
   the third inductor and the second sub line define a second directional coupler by generating electromagnetic coupling therebetween.

6. The electronic component according to claim 1, further comprising:
   a multilayer structure including a plurality of insulator layers stacked on each other in a stacking direction; wherein
   the first capacitor, the second capacitor, the first inductor, the second inductor, and the first sub line include conductor layers located on the insulator layers.

7. The electronic component according to claim 6, wherein
   the second inductor is electrically connected in parallel to the second capacitor;
   the second inductor and the second capacitor define a LC parallel resonator;
   the first capacitor and the first inductor define a high pass filter; and
   the first sub line does not overlap the first capacitor in planar view in the stacking direction.

8. The electronic component according to claim 6, further comprising a first ground conductor and a second ground conductor holding the first inductor and the first sub line therebetween along the stacking direction.

9. The electronic component according to claim 6, wherein each of the input port, the first output port, and the ground port is defined by an outer electrode located on an outer surface of the multilayer structure.

10. The electronic component according to claim 6, wherein the multilayer structure includes via-hole conductors connecting respective ones of the conductor layers.

11. The electronic component according to claim 1, wherein the first capacitor and the first inductor define a high pass filter including additional capacitors and inductors and an LC parallel resonator.

12. The electronic component according to claim 11, wherein a resonance frequency of the LC parallel resonator is higher than the cutoff frequency of the high pass filter.

13. The electronic component according to claim 4, wherein the high pass filter includes additional capacitors and inductors and the LC parallel resonator.

14. The electronic component according to claim 13, wherein a resonance frequency of the LC parallel resonator is higher than the cutoff frequency of the high pass filter.

15. The electronic component according to claim 7, wherein the high pass filter includes additional capacitors and inductors and the LC parallel resonator.

16. The electronic component according to claim 15, wherein a resonance frequency of the LC parallel resonator is higher than the cutoff frequency of the high pass filter.

17. The electronic component according to claim 1, wherein the electronic component is a diplexer.

18. The electronic component according to claim 2, further comprising:
- a second output port;
- a second low pass filter;
- a fourth capacitor;
- a third inductor electrically connected in parallel to the fourth capacitor; and
- a second sub line; wherein
- the second low pass filter and the fourth capacitor are electrically connected in series to one another between the input port and the second output port; and
- the third inductor and the second sub line define a second directional coupler by generating electromagnetic coupling therebetween.

19. The electronic component according to claim 3, further comprising:
- a second output port;
- a second low pass filter;
- a fourth capacitor;
- a third inductor electrically connected in parallel to the fourth capacitor; and
- a second sub line; wherein
- the second low pass filter and the fourth capacitor are electrically connected in series to one another between the input port and the second output port; and
- the third inductor and the second sub line define a second directional coupler by generating electromagnetic coupling therebetween.

20. The electronic component according to claim 4, further comprising:
- a second output port;
- a second low pass filter;
- a fourth capacitor;
- a third inductor electrically connected in parallel to the fourth capacitor; and
- a second sub line; wherein
- the second low pass filter and the fourth capacitor are electrically connected in series to one another between the input port and the second output port; and
- the third inductor and the second sub line define a second directional coupler by generating electromagnetic coupling therebetween.

* * * * *